(12) United States Patent
Cosley et al.

(10) Patent No.: US 7,258,161 B2
(45) Date of Patent: Aug. 21, 2007

(54) COOLING SYSTEM FOR DENSELY PACKED ELECTRONIC COMPONENTS

(75) Inventors: Michael R. Cosley, Crystal lake, IL (US); Richard L. Fischer, Lisle, IL (US)

(73) Assignee: Emerson Network Power, Energy Systems, North America, Inc., Warrenville, IL (US)

( * ) Notice: Subject to any disclaimer, the term of this patent is extended or adjusted under 35 U.S.C. 154(b) by 558 days.

(21) Appl. No.: 10/759,708

(22) Filed: Jan. 16, 2004

(65) Prior Publication Data

US 2004/0163797 A1    Aug. 26, 2004

Related U.S. Application Data

(63) Continuation-in-part of application No. 10/047,871, filed on Jan. 14, 2002, now Pat. No. 6,679,315.

(51) Int. Cl.
*F28D 15/00* (2006.01)
*H05K 7/20* (2006.01)

(52) U.S. Cl. .............................. 165/104.33; 165/80.4

(58) Field of Classification Search ........... 165/104.33, 165/80.4, 104.21; 361/683, 699, 700, 716, 361/719, 721, 725–726; 275/714–715
See application file for complete search history.

(56) References Cited

U.S. PATENT DOCUMENTS

| | | | |
|---|---|---|---|
| 3,361,195 A | | 1/1968 | Meyerhoff et al. |
| 3,481,393 A | * | 12/1969 | Chu ........................ 165/80.4 |
| 3,917,370 A | * | 11/1975 | Thornton et al. ........... 439/194 |
| 4,151,548 A | | 4/1979 | Klein et al. |
| 4,315,300 A | * | 2/1982 | Parmerlee et al. .......... 361/703 |
| 4,392,362 A | | 7/1983 | Little |
| 4,493,010 A | * | 1/1985 | Morrison et al. ........... 361/698 |
| 4,498,118 A | | 2/1985 | Bell |
| 4,561,040 A | | 12/1985 | Eastman et al. |
| 4,612,978 A | | 9/1986 | Cutchaw |
| 4,685,512 A | | 8/1987 | Edelstein et al. |
| 4,866,570 A | | 9/1989 | Porter |
| 4,940,085 A | | 7/1990 | Nelson et al. |
| 4,941,530 A | | 7/1990 | Crowe |
| 4,958,257 A | * | 9/1990 | Wenke ....................... 361/700 |
| 5,005,640 A | | 4/1991 | Lapinski et al. |
| 5,057,968 A | * | 10/1991 | Morrison .................... 361/700 |
| 5,067,047 A | | 11/1991 | Azar |

(Continued)

OTHER PUBLICATIONS

Little, William, Mar. 1978, IBM Corp., vol. 20 No. 10, p. 3919.

(Continued)

*Primary Examiner*—Tho Duong
(74) *Attorney, Agent, or Firm*—Harness, Dickey & Pierce, P.L.C.

(57) ABSTRACT

A more efficient cooling system for densely packed electronic components for use in an out-of-doors equipment enclosure. An array of cooling assemblies are placed on heat generating components mounted to printed circuit boards mounted in enclosure racks. Each board has a manifold for intake and exhaust of refrigerant, and larger rack manifolds are substituted for rails and are attached to a backplane. A hybrid package including a ceramic hybrid power module and an attached array of cooling assemblies provide even more density of components and improved cooling.

5 Claims, 17 Drawing Sheets

U.S. PATENT DOCUMENTS

| | | | |
|---|---|---|---|
| 5,088,005 A | | 2/1992 | Ciaccio |
| 5,099,311 A | | 3/1992 | Bonde et al. |
| 5,099,910 A | | 3/1992 | Walpole et al. |
| 5,159,529 A | | 10/1992 | Lovgren et al. |
| 5,169,372 A | | 12/1992 | Tecco |
| 5,177,666 A | * | 1/1993 | Bland et al. ............ 361/689 |
| 5,179,500 A | | 1/1993 | Koubek et al. |
| 5,183,104 A | | 2/1993 | Novotay |
| 5,216,578 A | * | 6/1993 | Zenitani et al. .......... 361/690 |
| 5,218,515 A | | 6/1993 | Bernhardt |
| 5,220,809 A | * | 6/1993 | Voss ..................... 62/259.2 |
| 5,285,347 A | | 2/1994 | Fox et al. |
| 5,316,075 A | | 5/1994 | Quon et al. |
| 5,365,749 A | | 11/1994 | Porter |
| 5,394,936 A | | 3/1995 | Budelman |
| 5,509,468 A | | 4/1996 | Lopez |
| 5,544,696 A | | 8/1996 | Leland |
| 5,587,880 A | | 12/1996 | Phillips et al. |
| 5,696,405 A | | 12/1997 | Weld |
| 5,769,154 A | | 6/1998 | Adkins et al. |
| 5,823,005 A | | 10/1998 | Alexander et al. |
| 5,870,823 A | | 2/1999 | Bezama et al. |
| 5,923,533 A | * | 7/1999 | Olson ..................... 361/699 |
| 6,039,114 A | | 3/2000 | Becker et al. |
| 6,679,315 B2 | * | 1/2004 | Cosley et al. ............ 165/80.4 |
| 2003/0010050 A1 | | 1/2003 | Scott |

OTHER PUBLICATIONS

"An Electrodynamic Polarization Micropump for Electronic Cooling"; J. Darabi and D. DeVoe; Journal of Microelectromechanical Systems, vol. 10, No. 1, pp. 98-106, Mar. 2001.

"Heat Transfer from Micro-Finned and Flat Surfaces to Flow of Fluorinert Coolant; Boiling Heat Transfer"; Mizunuma et al.; 1998 InterSociety Conference on Thermal Phenomena, pp. 386-391, Aug. 1998.

"Imersion Cooling of Electronics in Fluidized Beds of Dielectric Particles"; Robert C. Brown and Scott S. Jasper; Heat Transfer Engineering, vol. 10, No. 3 pp. 36-42, 1989.

"Optimal Structure for Microgrooved Cooling Fin to High-Power LSI Devices"; S. Sasaki and T. Kishimoto; Electronics & Mechanics Technology Laboratories, Oct. 21, 1986.

"Gas Cooling Enhancement Technology for Integrated Circuit Chips"; Kishimoto et al.; IEEE Transactions of Components, Hybrids, and Manufacturing Technology, vol. CHMT-7, No. 3, pp. 286-293, Sep. 1984.

"The Effect of Tip Convection on the Performance and Optimum Dimensions of Cooling Fins"; K. Laor and H. Kalman; Int. Comm. Heat mass. Transfer, vol. 19, pp. 569-584, 1992.

"Pool Boiling Heat Transfer From Plain and Microporous, Square Pin-Finned Surfaces in Saturated FC-72"; K.N. Rainey and S.M. You; Journal of Heat Transfer, vol. 122, pp. 509-516, Aug. 2000.

"Effects of Perpendicular Flow Entry on Convective Heat/Mass Transfer From Pin-Fin Arrays"; Chyu et al.; Journal of Heat Transfer; vol. 121, pp. 668-674, Aug. 1999.

"Pool Boiling Heat Transfer With an Array of Flush-Mounted, Square Heaters on a Vertical Surface"; S.M. You et al; Journal of Electronic Packaging; vol. 119, pp. 17-24, Mar. 1997.

"Combined Pressure and Subcooling Effects on Pool Boiling From a PPGA Chip Package"; A.A. Watwe et al; Journal of Electronic Packaging, vol. 199, pp. 95-105, Jun. 1997.

"Analytic Modeling, Optimization, and Realization of Cooling Devices in Silicon Technology"; Perret et al.; IEEE Transactions on Components and Packaging Technologies, vol. 23, No. 4, pp. 665-671, Dec. 2000.

* cited by examiner

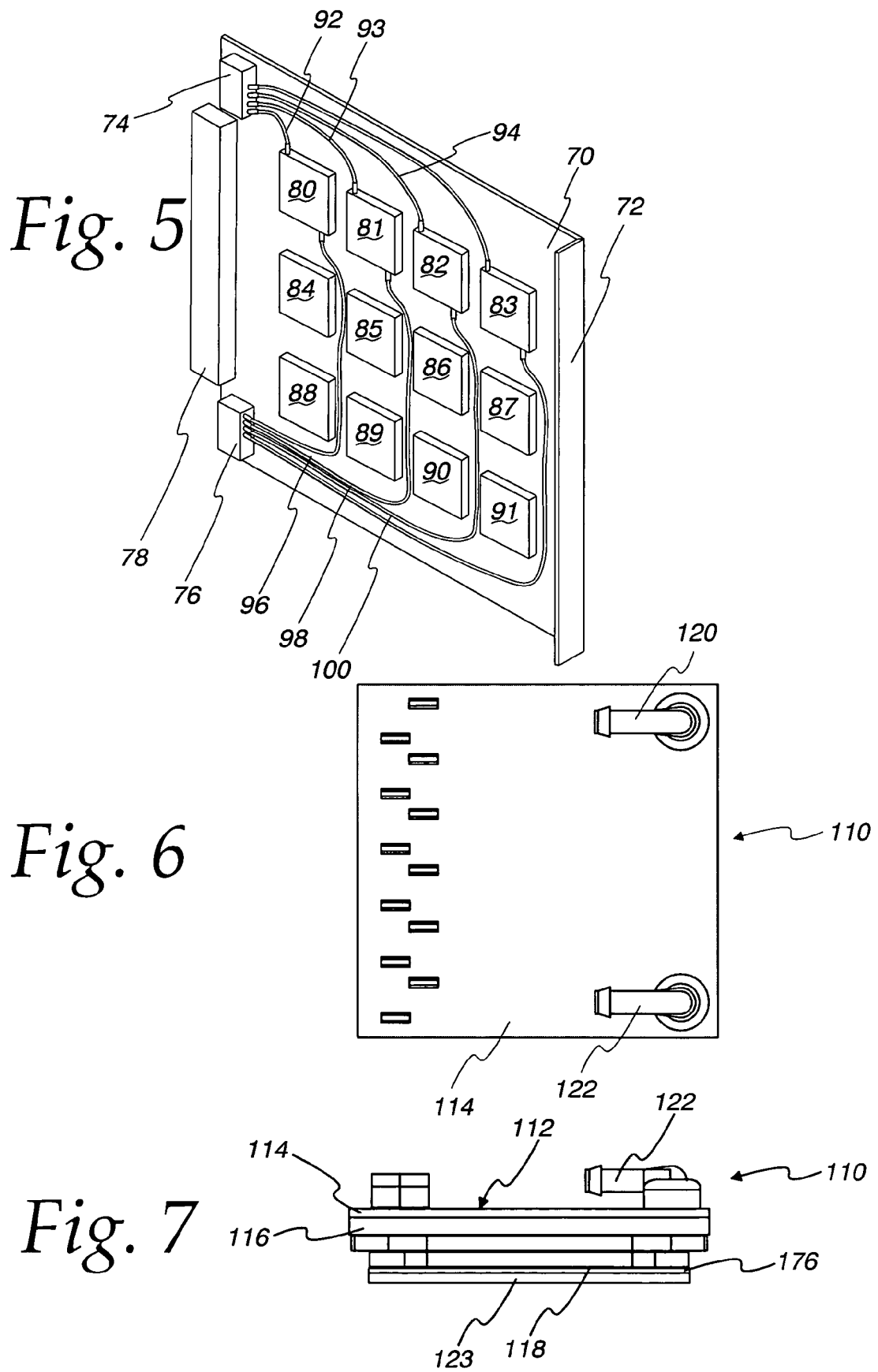

COOLING SYSTEM FOR DENSELY PACKED ELECTRONIC COMPONENTS

CROSS REFERENCE TO RELATED APPLICATIONS

The present application is a continuation-in-part of application Ser. No. 10/047,871, filed Jan. 14, 2002, entitled "Small Scale Chip Cooler Assembly", now U.S. Pat. No. 6,679,315. The benefit of the priority date of the above mentioned parent application is claimed for all common subject matter.

STATEMENT REGARDING FEDERALLY SPONSORED RESEARCH

Not applicable

BACKGROUND OF THE INVENTION

1. Field of the Invention

The present invention relates to a cooling system and more particularly to a compact cooling system for densely packed electronic components for efficiently and effectively cooling powerful electronic components, the system being easily configurable and of high reliability.

2. Description of the Related Art

As microprocessors, such as Intel's Pentium brand series, become more powerful, they also generate more heat. To prevent failure and to ensure optimum capability, it is necessary to remove heat and to maintain the temperature of these microprocessors within a predetermined range. In certain environments, such as electrical equipment enclosures, heat generating components are being packed more densely than in existing enclosures. Excessive heat results. A number of previous devices have been proposed. See for example, U.S. Pat. Nos. 4,392,362; 4,498,118; 5,067,047; 5,088,005; 5,099,311; 5,099,910; 5,183,104; 5,218,515; 5,285,347; 5,365,749; 5,394,936; 5,509,468; 5,823,005; and 5,870,823. The search, however, goes on for more effective, efficient and reliable cooling systems.

BRIEF SUMMARY OF THE INVENTION

What is described is a cooling system including a board having a plurality of heat generating components, a plurality of cooling assemblies where one of the cooling assemblies is connected to one of the plurality of heat generating components, an intake manifold mounted to the board, an exhaust manifold mounted to the board and fluid conduits connecting the intake and exhaust manifolds and the cooling assemblies.

There are a number of advantages, features and objects achieved with the present invention which are believed not to be available in earlier related devices. For example, the present invention provides for increased component density, increased cooling efficiency, improved component reliability, greater compactness, easy configuration, both in routing and in size, low pressure, and ease in retrofitting. The present invention also benefits less critical components nearby, provides for quick disconnects and allows below ambient cooling. The present invention further provides for vertical integration of power and controls so as to free rack space and better manages enclosure air flow.

A more complete understanding of the present invention and other objects, advantages and features thereof will be gained from a consideration of the following description of a preferred embodiments read in conjunction with the accompanying drawing provided herein. The preferred embodiments represent examples of the invention which are described here in compliance with Title 35 U.S.C. section 112 (first paragraph), but the invention itself is defined by the attached claims.

BRIEF DESCRIPTION OF THE SEVERAL VIEWS OF THE DRAWING

FIG. 5 is a diagrammatic isometric view of a printed circuit board with an array of cooling assemblies.

FIG. 6 is a top plan view of a cooling assembly.

FIG. 7 is a side elevation view of the cooling assembly attached to a heat generating component.

DETAILED DESCRIPTION OF A PREFERRED EMBODIMENT OF THE INVENTION

Figure 1:
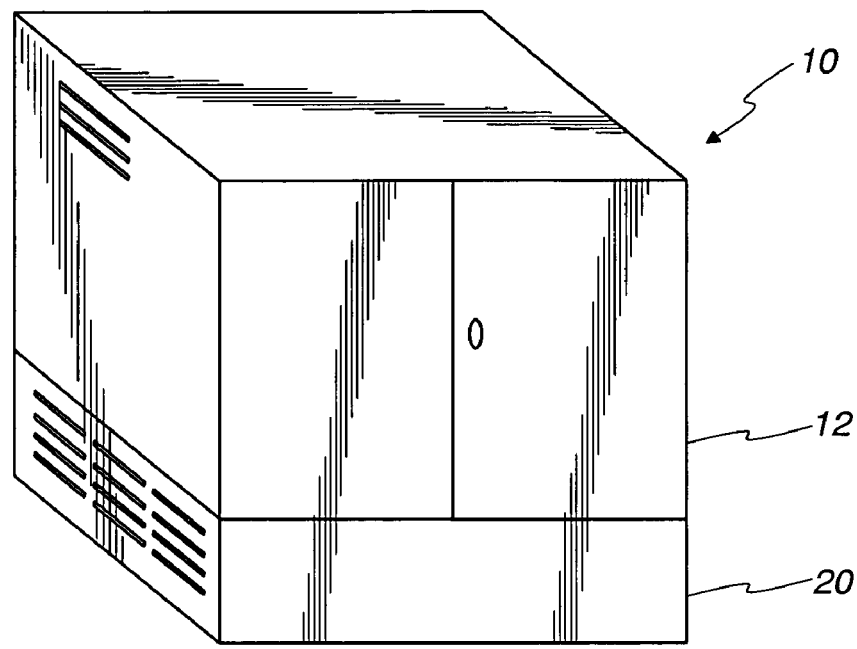
FIG. 1 is an isometric view of an electronic equipment enclosure.

While the present invention is open to various modifications and alternative constructions, the preferred embodiments shown in the various figures of the drawing will be described herein in detail. It is understood, however, that there is no intention to limit the invention to the particular embodiments, forms or examples disclosed. On the contrary, the intention is to cover all modifications, equivalent structures and methods, and alternative constructions falling within the spirit and scope of the invention as expressed in the appended claims, pursuant to Title 35 U.S.C. section 112 (second paragraph).

As used here, the term "microscale" refers to a very small scale consistent with the size of microchips, such as Intel's Pentium brand processor. A synonym of microscale is "mesoscale." The term "microsystem" refers directly to a microchip such as the Pentium brand processor. The reference to the Pentium brand processor is not to be considered limiting in any way and other microprocessors may be substituted. Also, future microprocessors of the same, similar, smaller or even larger size are considered within the scope, range and extent of the present invention. The term "pool boiling" involves the technology of boiling heat transfer and is a term well known by those skilled in the art. The term also appears in research articles such as the article, "Pool Boiling Heat Transfer From Plain And Microporous, Square Pin-Finned Surfaces In Saturated FC-72." This article appeared in the August, 2000 edition of the *Journal of Heat Transfer*, pages 509-516.

Figure 2:
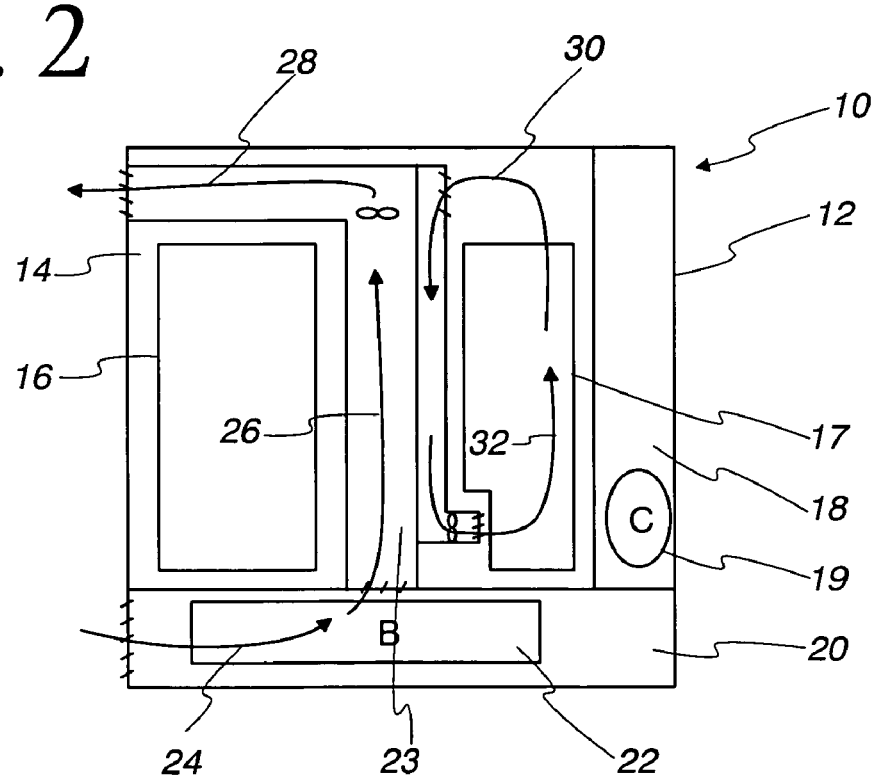
FIG. 2 is a diagrammatic elevation view of the enclosure.

Referring now to FIGS. 1 and 2, there is illustrated in diagrammatic form an electronic equipment enclosure 10 of the type used for telecommunications and data transmission. The enclosure includes a cabinet 12, a components compartment 14 with two equipment racks 16, 17, a utility compartment 18 with a compression condenser unit 19, a battery compartment 20 with backup batteries 22 and a heat exchanger 23. An air conditioner may also be used. The heat exchanger provides a mechanism for cooling the air inside the components compartment using ambient air. The ambient airflow is indicated by the arrows 24, 26, 28 and the internal airflow is indicated by the arrows 30, 32. A similar internal airflow exists around the equipment rack 16.

In certain situations, the ambient air heat exchanger or an air conditioner is sufficient to keep temperature inside the enclosure cabinet within acceptable limits. However, when more powerful, greater heat generating components are installed, there is a need for better cooling because such components achieve better reliability when their temperature is maintained around a constant, such as 25° C., and the component is not subjected to temperature cycling.

Figure 3:
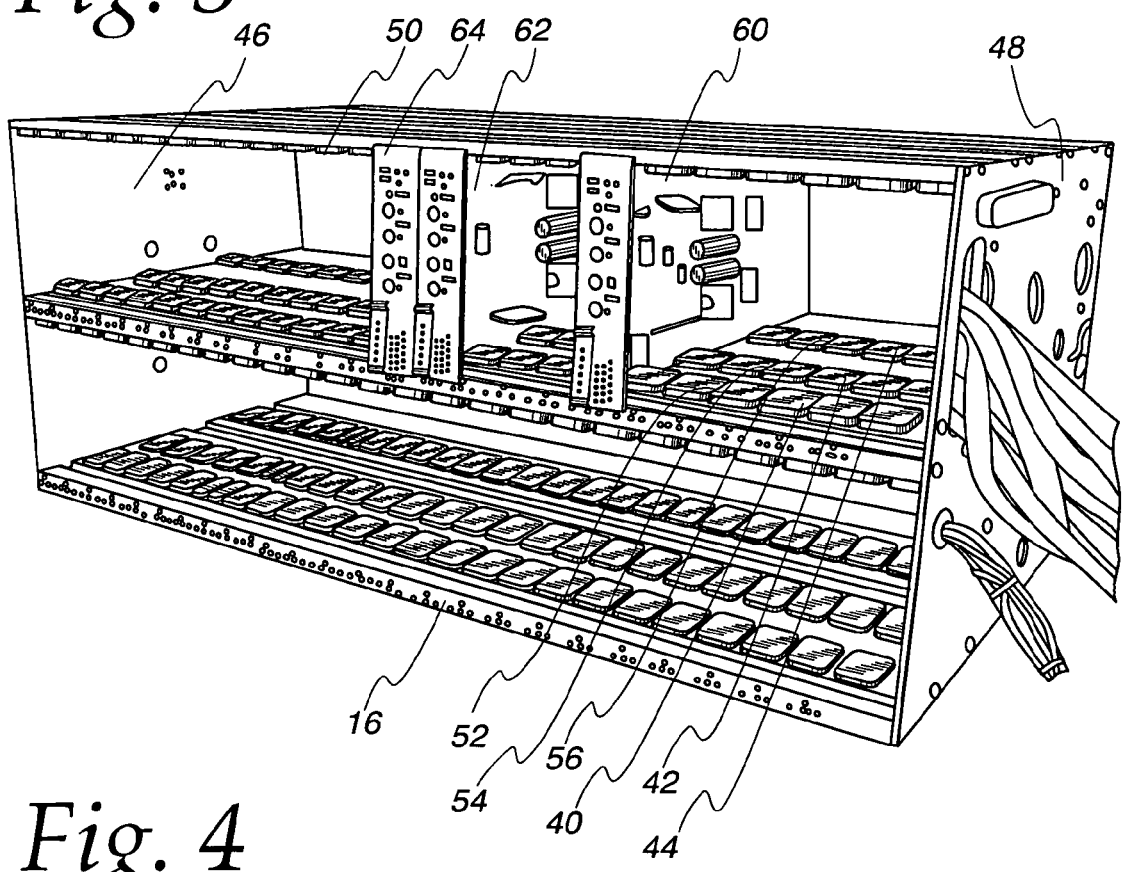
FIG. 3 is a front isometric view of an enclosure rack.
Figure 4:
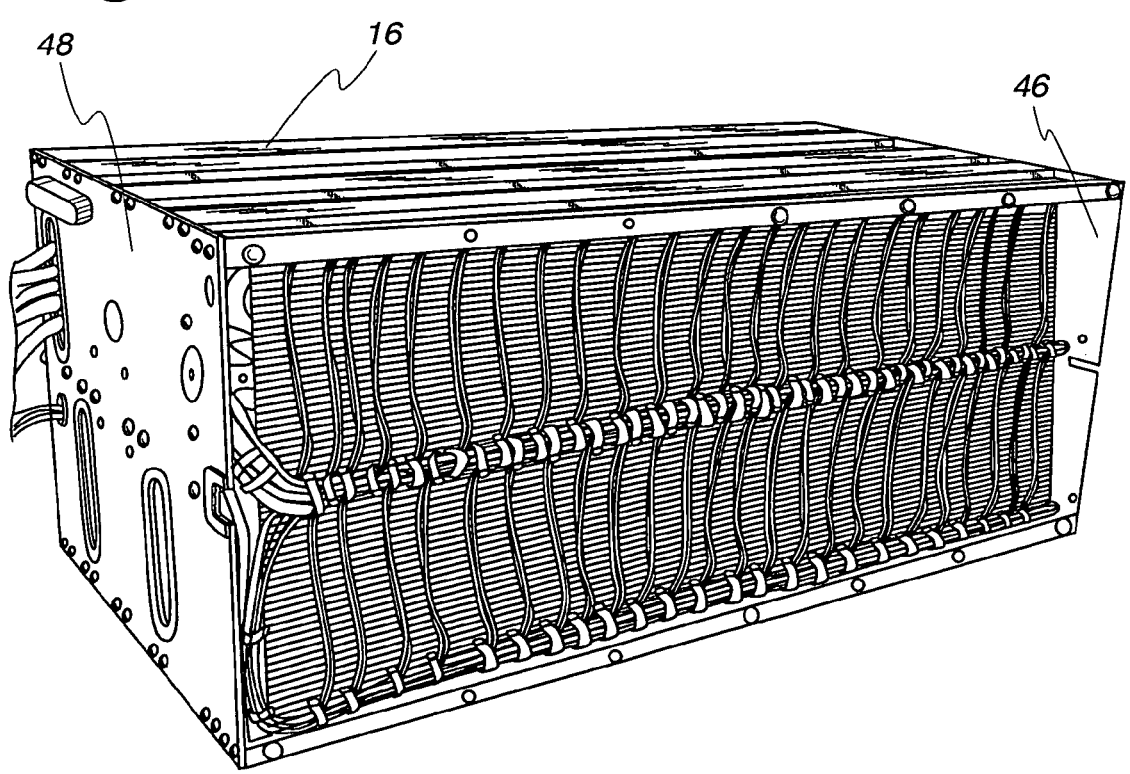
FIG. 4 is a rear isometric view of the enclosure rack.
Figure 8:
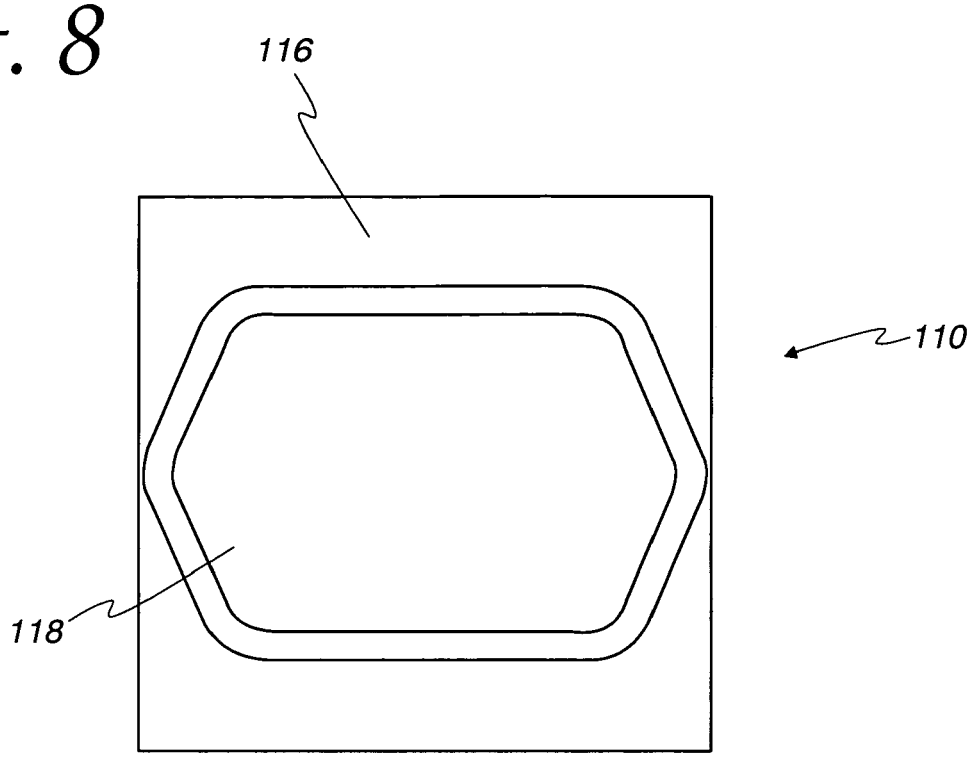
FIG. 8 is a bottom plan view of the cooling assembly.
Figure 9:
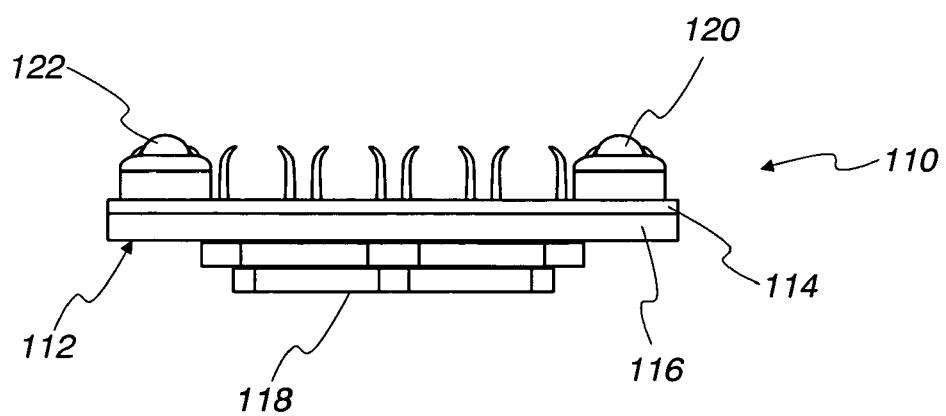
FIG. 9 is a front elevation view of the cooling assembly.

An enclosure rack is exemplified by the rack 16 shown in FIGS. 3 and 4. The rack includes rails 40, 42, 44, end walls 46, 48 and a backplane 50. The rails include slots, such as the slots 52, 54, 56 for receiving a plurality of boards in the form of printed circuit boards (PCB) 60, 62, 64. Each PCB includes a plurality of components, many of which are critically sensitive to heat.

FIG. 5 illustrates a PCB 70 having a face plate 72 at one end and at the other end, an intake manifold 74, an exhaust manifold 76 and a backplane connector 78. Mounted to the PCB are a plurality of attached heat generating components and microscale cooling assemblies 80, 81, 82, 83, 84, 85, 86, 87, 88, 89, 90, 91. Each of the cooling assemblies is connected to fluid conduits in the form of tubes communicating the cooling assembly to the intake and exhaust manifolds. For example, the cooling assemblies 80, 81, 82 are attached to tubes 92, 93, 94, respectively communicating with the intake manifold 74 and tubes 96, 98, 100 respectively communicating with the exhaust manifold 76. Intake and exhaust tubes are typically connected to each of the other cooling assemblies 83, 84, 85, 86, 87, 88, 89, 90, 91 but have been removed in FIG. 5 for the sake of clarity.

As will be explained below each of the tubes carry a refrigerant from and back to a compressor. The arrangement shown in FIG. 5 offers a number of advantages over existing enclosure arrangements. Direct cooling allows increased density of components, a major benefit where space is usually at a premium. Also board space is not lost. Direct attachment of the cooling assembly to the component increases cooling efficiency and also component reliability. There is no need for a mechanical clamp because of the low weight and center of gravity of the cooling assembly. The arrangement allows easy configuration of equipment racks in terms of routing and size. The cooling system is low pressure and it relieves the enclosure cooling system described above. The arrangement also benefits less critical components located nearby because heat does not dissipate to surrounding components.

Referring now to FIGS. 6-9, an example of a microscale cooling system 110, is illustrated. The system includes a housing 112, which is comprised of a cover member 114 and a base member 116. The system also includes an evaporator 118. Mounted to the cover are an inlet fitting 120 and an outlet fitting 122. Directly attached to the evaporator is an electronic component 123. An adhesive may be used. The cover and base are made of any suitable thermally insulating synthetic resin, such as Nylon 6 or PBT. By the term "thermally insulating", it is meant a material having low thermal conductivity. The cover and base act as an insulator for refrigerant or other heat transferring fluid, liquid and gas flowing within the assembly. Formed between the base and the evaporator is an evaporator chamber to be described below.

Figure 10:
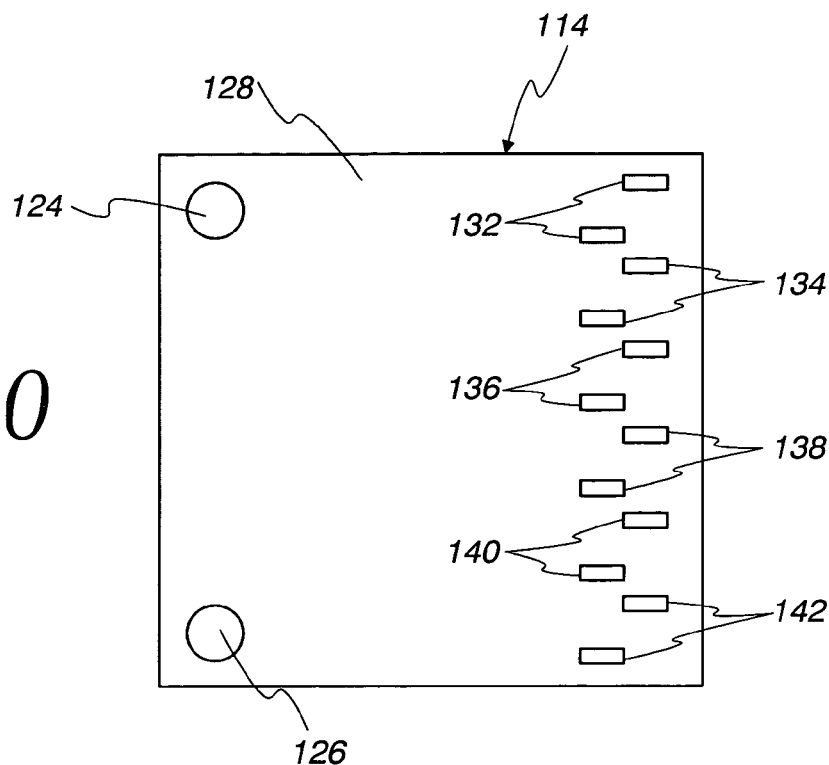
FIG. 10 is a top plan view of a cover of the cooling assembly rotated 180 degrees from the view shown in FIG. 1.
Figure 11:
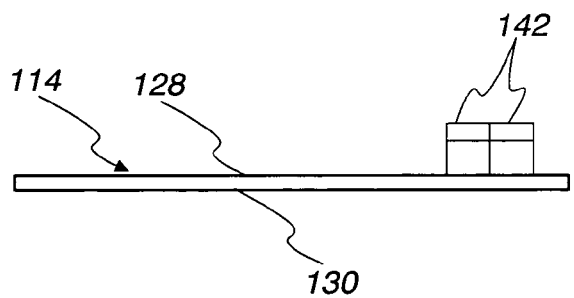
FIG. 11 is a side elevation view of the cover.
Figure 12:
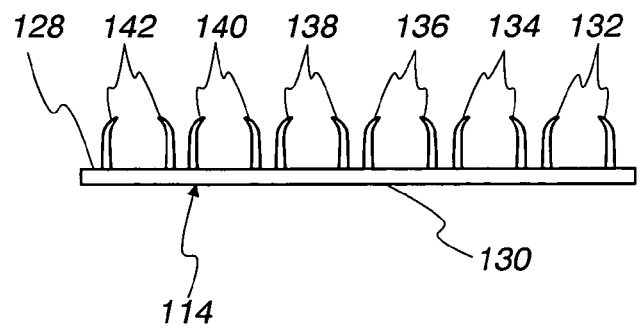
FIG. 12 is a rear elevation view of the cover.
Figure 13:
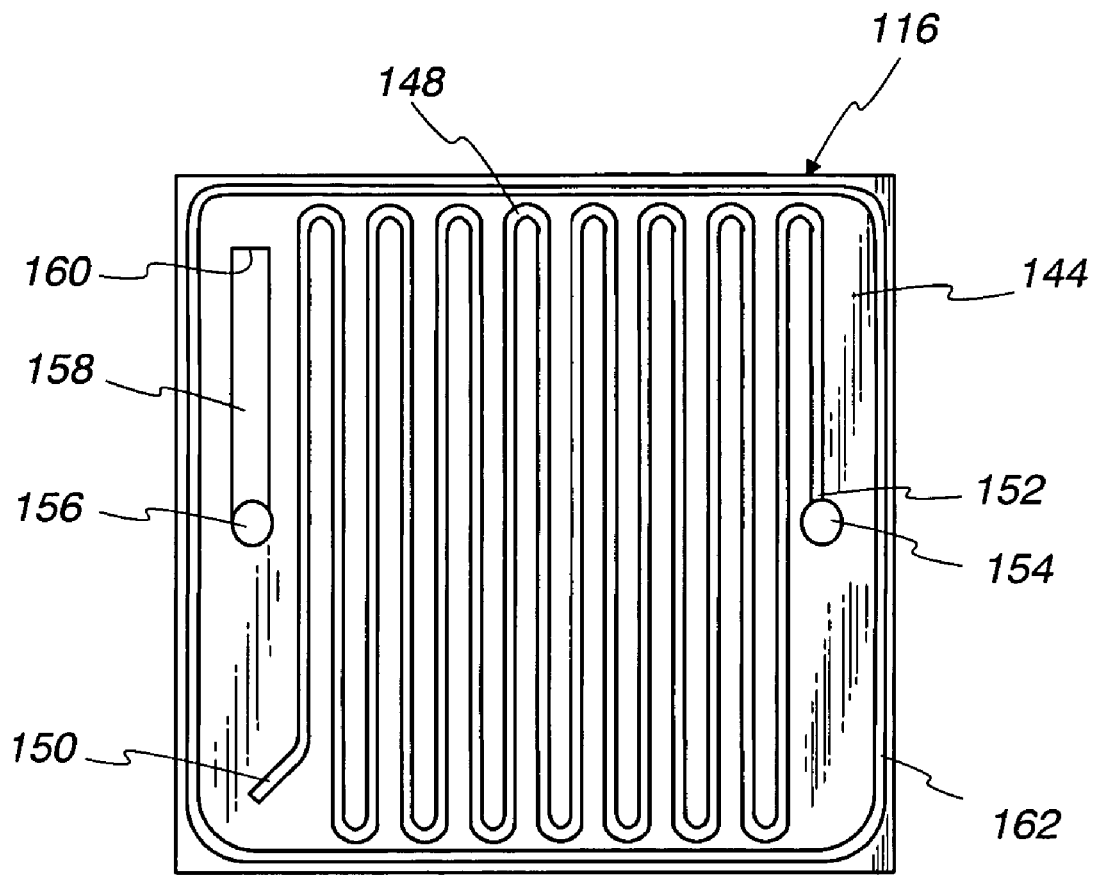
FIG. 13 is a top plan view of a base member of the cooling assembly.
Figure 14:
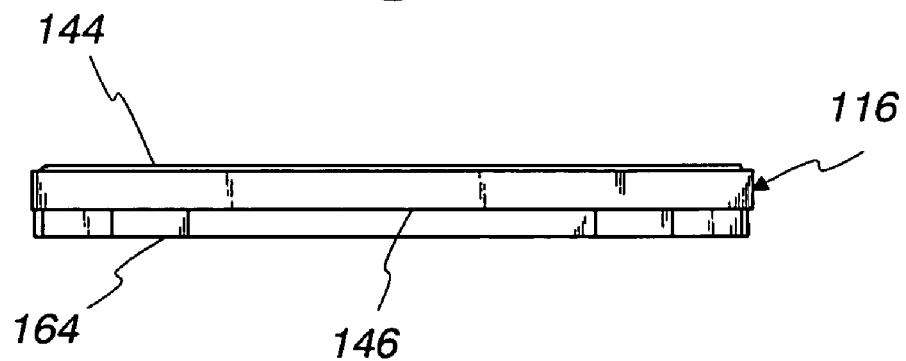
FIG. 14 is a side elevation view of the base member.
Figure 15:
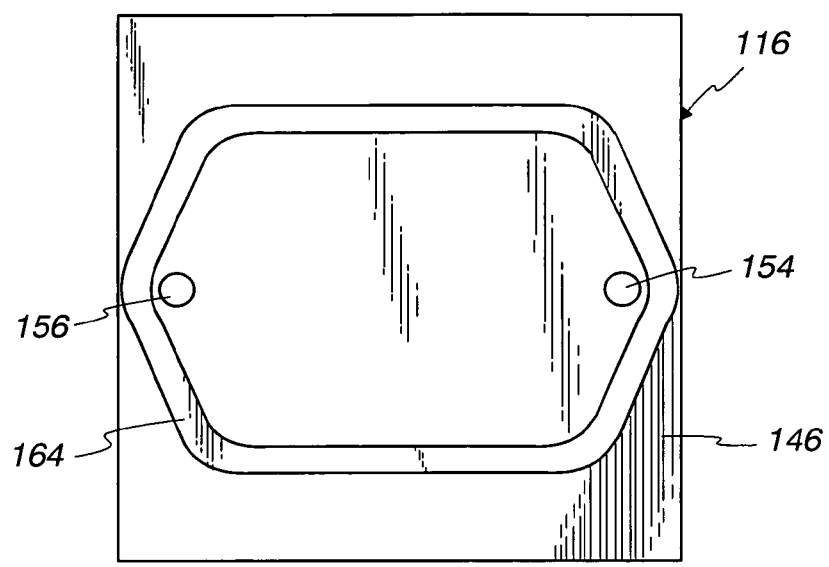
FIG. 15 is a bottom plan view of the base member.
Figure 16:
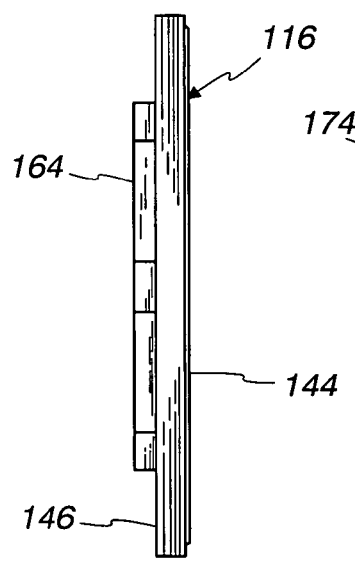
FIG. 16 is a rear elevation view of the base member.
Figure 17:
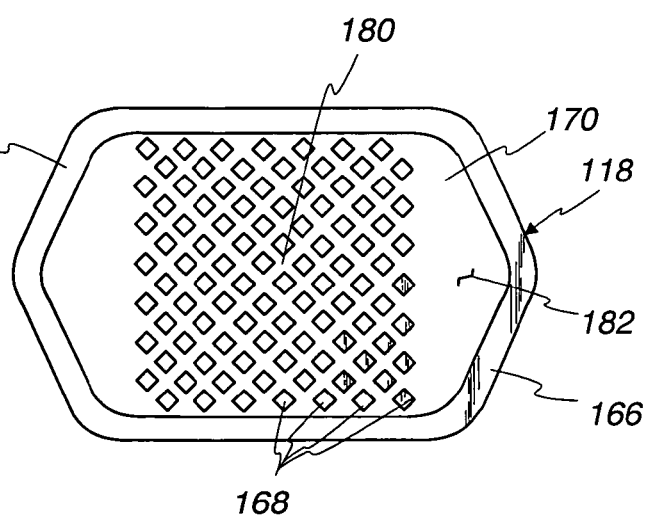
FIG. 17 is a top plan view of a thermally conductive element of the cooling assembly.
Figure 18:
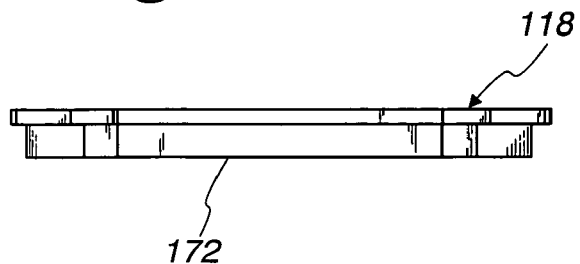
FIG. 18 is a side elevation view of the thermally conductive element.
Figure 19:
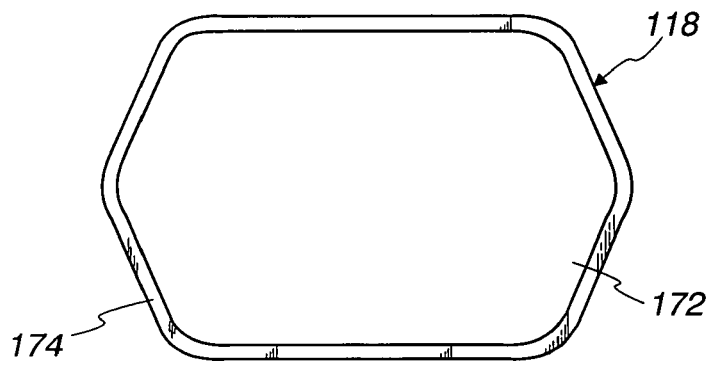
FIG. 19 is a bottom plan view of the thermally conductive element.
Figure 20:
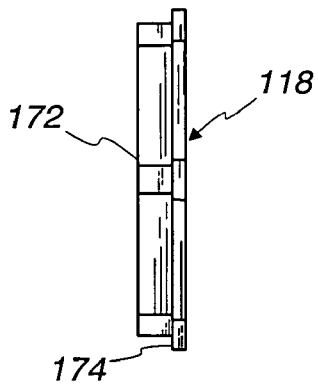
FIG. 20 is a front elevation view of the thermally conductive element.

The cover 114 is a generally flat plate having two holes 124, 126, FIGS. 10-12, for forming inlet and outlet ports, respectively. The cover includes an outside surface 128 and an inside surface 130. Mounted to the cover on the outside surface are the inlet fitting 120 and the outlet fitting 122, FIGS. 6, 7 and 9. Also mounted to or formed on the outside surface of the cover are a series of paired grooming clips 132, 134, 136, 138, 140, 142 for aligning and constraining the tubes supplying a refrigerant or fluid for absorbing heat and conduits for carrying away gas phase refrigerant or other gas phase product back to a compressor as will be explained below. The cover is generally square with each side measuring about forty millimeters. The cover may be one-half to one millimeter thick.

Referring now to FIGS. 13-16, the base 116 is also a generally flat plate having a first surface 144 and a second surface 146. The first surface 144 abuts and is sealed to the inside surface 130 of the cover. Formed in the first surface of the base is a capillary passage 148 having as a top wall the inside surface 130 of the cover 114. The capillary passage has an upstream end 150 and a downstream end 152. The upstream end 150 aligns with the inlet port 124 of the cover 114 so that liquid pumped to the inlet port enters the capillary passage 148. The capillary passage may be serpentine to allow its length to be adjusted as desired by forming more or less loops. The length of the capillary passage depends upon the fluid used and the heat lift capacity desired as well as other factors. The cross-sectional dimensions of the capillary passage are also related to the length of the capillary passage. These physical characteristics balance flow, ability to pump and provide the required pressure drop. The downstream end 152 of the capillary passage adjoins an opening 154 in the base 116. The capillary passage may be formed in the base by molding or by hot embossing or by any other convenient manufacturing technique known or developed in the future. Generally, the capillary passage is square shaped in cross section having a side dimension of about two hundred and fifty microns. The passage may be semicircular or trapezoidal in shape and each corner may have a radius. The base 116 may have a thickness of about one millimeter.

The base 116 also includes a second opening 156 which aligns with an elongated recess 158. A far end portion 160 of the recess aligns with the outlet port 126, FIG. 10, in the cover 114. The base may also include a sealing ridge 162 around the periphery of the first surface 144. The sealing ridge facilitates assembly of the cover to the base by ultrasonic welding, laser welding or RF welding, processes which are well known to those skilled in the art. Extending from the second surface 146 is a mounting flange 164. The flange 164 will engage a lip of the evaporator 118, FIG. 8, as will be explained below. The mounting flange has an oblong hexagonal shape as is readily seen in FIG. 15.

The fluid referred to above may be any heat transferring fluid including a refrigerant, such as those known as R236fa, R123, R134a, R124, or $CO_2$. Also, any suitable dielectric fluid or other suitable refrigerant may be used as is well known to those skilled in the refrigerant art. Further, other heat transferring fluids may be used, such as those marketed under the brands DYNALENE, FLUORINET, NOVEC, FLUTEC and a liquid slurry with encapsulated phase change materials (PCM). As is also well understood to those skilled in the art, the liquid is formed by compressing a gas to its liquid phase and then cooling the liquid before being exposed to heat. Upon the transfer of heat, the liquid again returns to a gas phase. Or the liquid is pumped into an evaporator and picks up heat via forced convection or by flow or pool boiling where it becomes a gas or gas mixture which is later condensed to a liquid. Other fluids can also be used as is well known to those skilled in the art.

The evaporator 118, FIGS. 17-20, is a thermally conductive element in the form of a metal plate 166 with a number of projections or fins 168, as they are usually called, mounted to an inside surface 170. An outside surface 172 of the evaporator is generally flat and is adapted to be connected to a heat source such as a microprocessor. The evaporator may also be connected to other small heat generating mechanisms, such as transistors, power semiconductors, laser optical IGBTs or other electronic or optoelectronic devices. The term "microsystem" is used here to refer to all such items and others, whether now in existence or developed in the future. The evaporator is formed of a material having high thermal conductivity, such as copper or aluminum. The evaporator is attached to the base by any convenient means, such as molding the base to the evaporator or using other techniques known by those in the art. The evaporator 118 includes a lip 174 around its periphery which may form an interference fit with the mounting flange 164 of the base 116. See also FIG. 21. The evaporator may be connected to a microsystem by a thermal adhesive 176, FIG. 7, thermal pad, or an evaporator may be molded or formed as a part of the microsystem should that prove more effective or efficient. All of these techniques are commercially available and add considerable flexibility to the design.

Figure 21:
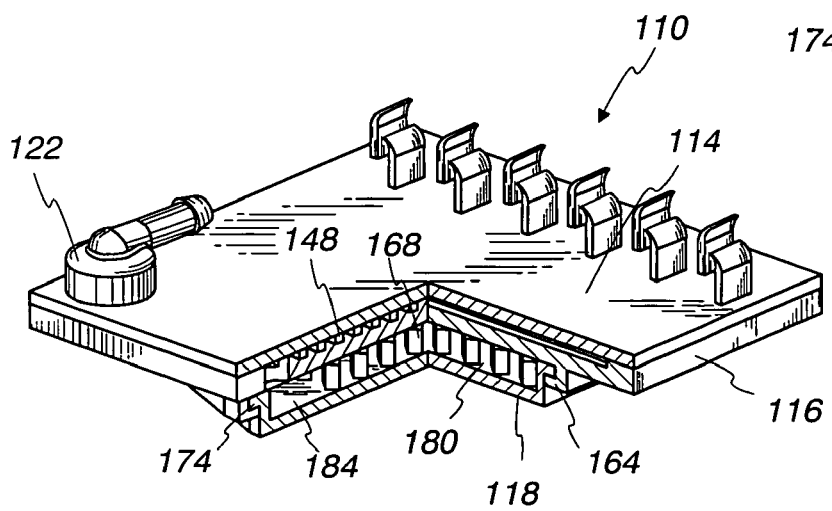
FIG. 21 is a partial sectional isometric view of the cooling assembly.
Figure 22:
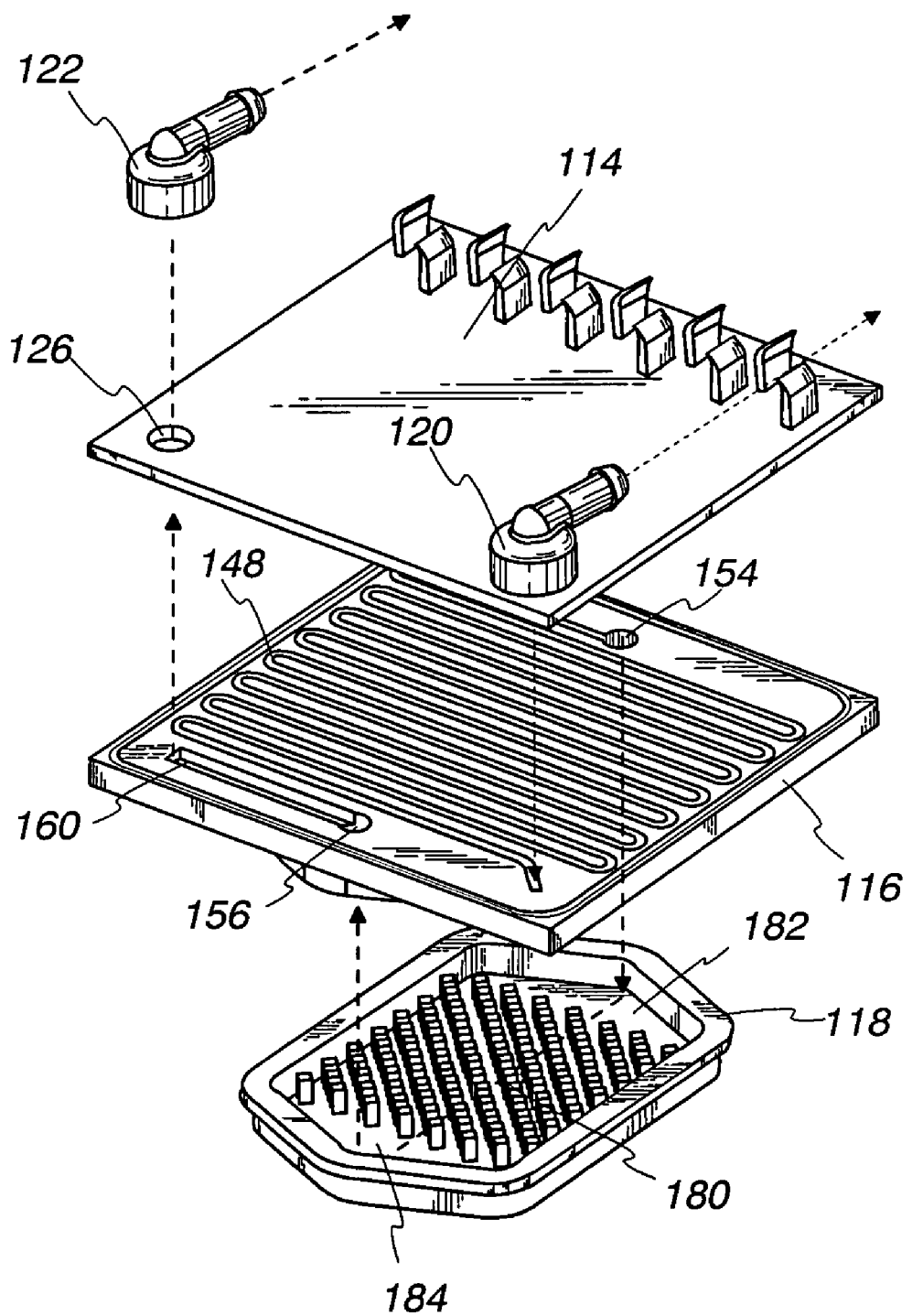
FIG. 22 is an exploded isometric view of the cooling assembly.

An evaporator chamber 180, FIGS. 21 and 22, is formed between the evaporator 118 and the base 116, downstream of the capillary passage 148 and upstream of the outlet port 126 and among the fins 168. An expansion zone 182 is also formed between the evaporator and the base, and more particularly immediately downstream of the opening 154. The expansion zone is also immediately upstream of the evaporator chamber 180. This allows liquid in the capillary passage to cool in the expansion zone 182 and then pass into the evaporator chamber where pool boiling occurs among the fins.

When passing through the evaporator chamber, the heat transferring fluid will change phase to a gas or it will remain liquid when absorbing heat from the evaporator. The gas or liquid proceeds to a collection region 184 downstream of the evaporator chamber before exiting through the outlet port 126 and back to a compressor.

Figure 23:
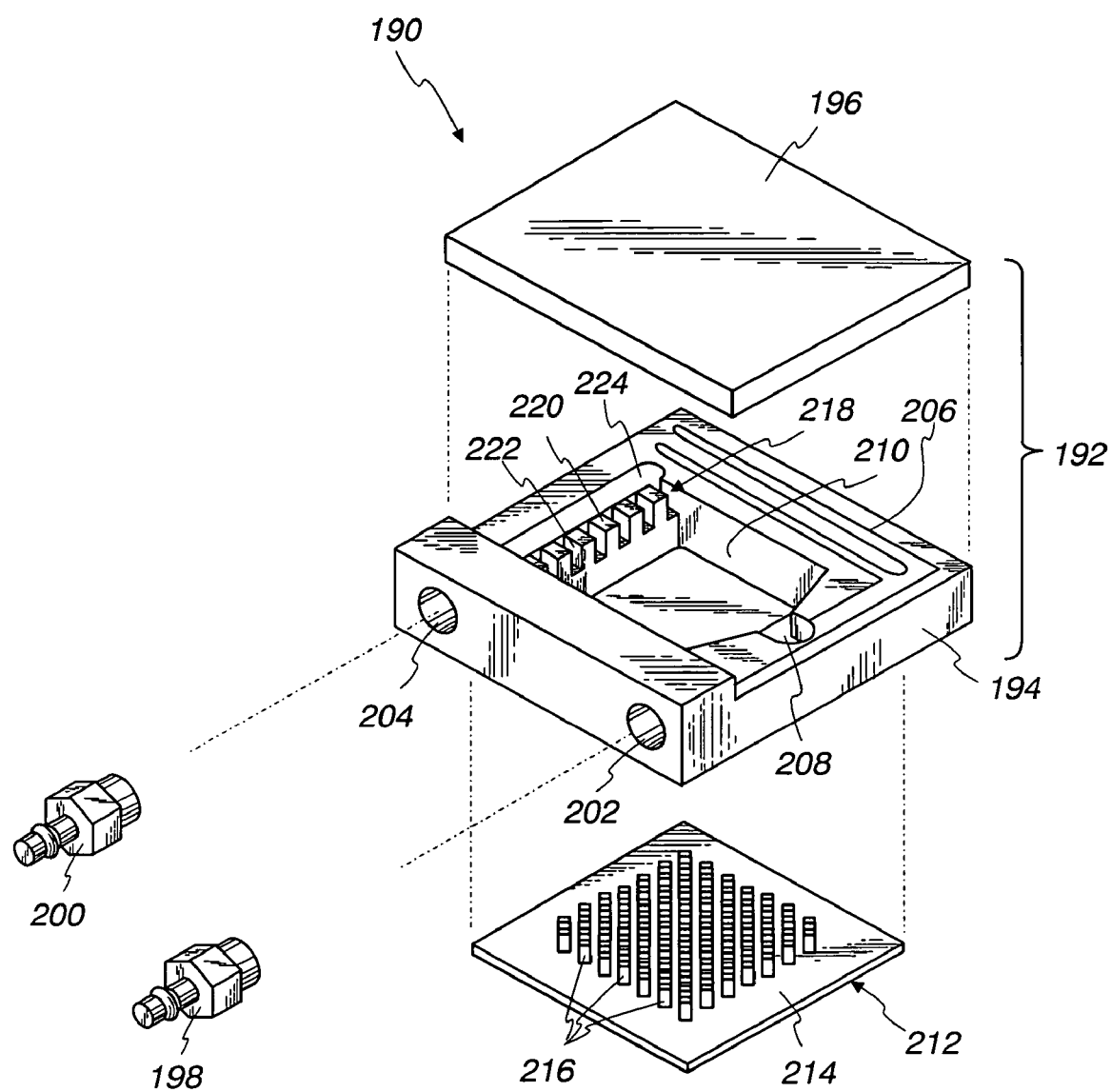
FIG. 23 is an exploded isometric view of another embodiment of the cooling assembly.

Referring now to FIG. 23, a cooling system 190 with a slightly different construction is disclosed. A housing 192 includes a base 194 and a cover 196. Inlet and outlet fittings 198, 200 are located in inlet and outlet ports 202, 204, respectively. A capillary tube 206 is formed in the base 194. An expansion port 208 is formed in the base 194 and an evaporator chamber 210 is also formed in the base. An upper wall of the evaporator chamber is formed by the cover 196. A lower wall of the evaporator chamber is formed by an evaporator 212 and includes a plate 214 with a multitude of fins 216. Downstream of the evaporator chamber is a region 218 which includes upstanding blocks, such as the block 220 which alternate with passageways between the blocks, such as the passageway 222. The blocks form multiple exhaust ports to help separate flow to make more efficient use of the evaporator, to minimize orientation effects, to reduce pressure drop and to minimize blockage due to contamination. Downstream of the blocks is a passage 224 which is upstream of the outlet port 204. Like the assembly shown in FIG. 6, the construction of the embodiment in FIG. 23 includes a high thermally conductive evaporator and low thermally conductive cover and base.

In operation, the refrigerant is at an elevated pressure when delivered to the inlet fitting 120, FIG. 22. In a device where R236 is the refrigerant and a heat lift of fifty watts is sought, the inlet pressure is about fifty-five psi, the flow rate is about 0.00055 kilograms per second and the capillary passage 148 is about two inches long and may have a square cross section of about 0.250 millimeters per side. The length of the cooling system is about forty millimeters, the width about forty millimeters and the height about seven millimeters. The fins or pins, as they are sometimes called, in the evaporator chamber may be about one millimeter square in cross section and about five millimeters in height. With such an arrangement, a Pentium brand microsystem may have a surface temperature maintained within the range of –20 to 50° C., depending on application and fluid selected.

The refrigerant is compressed in a compressor and cooled by a condenser before entering the capillary passage 148. A heat transfer fluid may be pumped. Thereafter, the refrigerant expands, absorbs heat by pool boiling, forced convection or flow boiling (or a combination of these) in the evaporator chamber 180, leaves through the opening 156 in the base and the outlet port 126 before returning to the compressor for the start of a new cycle. Should more heat lift be desired, the capillary passage may be enlarged, the inlet pressure increased, and/or the evaporator changed to a material having a higher heat conductivity. The circulating liquid may also be changed. If less heat lift is needed, the capillary passage size may be reduced, the flow rate lessened, the refrigerant altered and/or the like. Other variables may also change. There is no intention to limit the invention here due to changes in the amount of heat lift required or desired.

The pressure drop provided by the capillary passage is proportional to L divided by $d^2$ where L is length and d is hydraulic diameter. The advantage of a design that accommodates a long capillary passage is that the width and depth of the passage may be proportionately larger. This is beneficial in that the passage becomes more be resistant to clogging. Also, a larger dimensioned passage may be easier to consistently manufacture.

Figure 24:
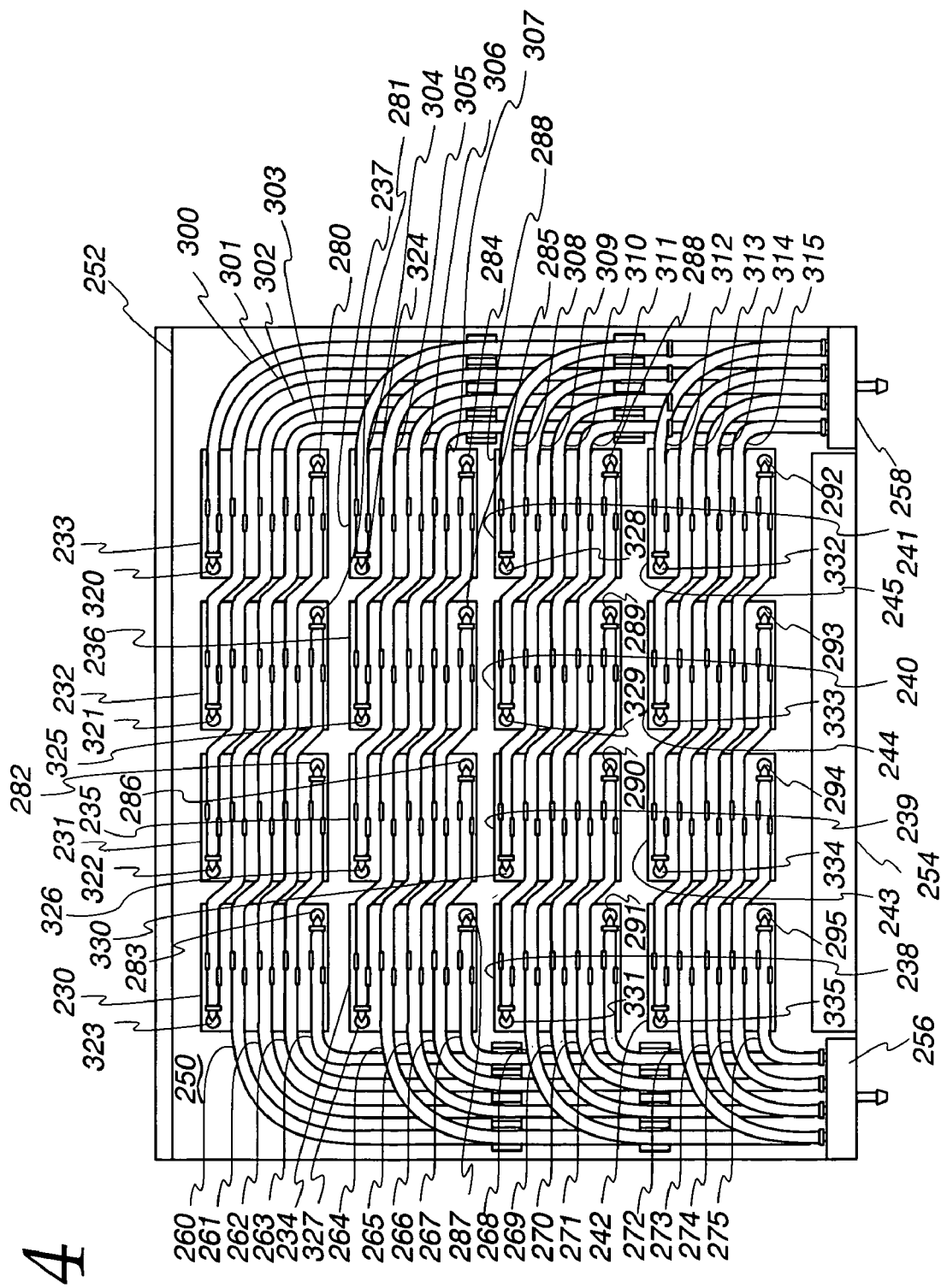
FIG. 24 is a diagrammatic plan view of a printed circuit board with a larger array of cooling assemblies than that shown in FIG. 5.

Referring now to FIG. 24, a matrix of sixteen cooling assemblies and components 230, 231, 232, 233, 234, 235, 236, 237, 238, 239, 240, 241, 242, 243, 244, 245 are mounted to a PCB 250. The PCB also mounts a face plate 252, a backplane connector 254, an intake manifold 256 and an exhaust manifold 258. As with the embodiment shown in FIG. 5, a refrigerant tube 260, 261, 262, 263, 264, 265, 266, 267, 268, 269, 270, 271, 272, 273, 274, 275 connects each inlet fitting 280, 281, 282, 283, 284, 285, 286, 287, 288, 289, 290, 291, 292, 293, 294, 295 with the intake manifold 256. Sixteen refrigerant tubes 300, 301, 302, 303, 304, 305, 306, 307, 308, 309, 310, 311, 312, 313, 314, 315 also connect sixteen outlet fittings 320, 321, 322, 323, 324, 325, 326, 327, 328, 329, 330, 331, 332, 333, 334, 335 with the exhaust manifold 258. In this manner refrigerant is distributed to the sixteen cooling assemblies on the PCB 250.

Figure 25:
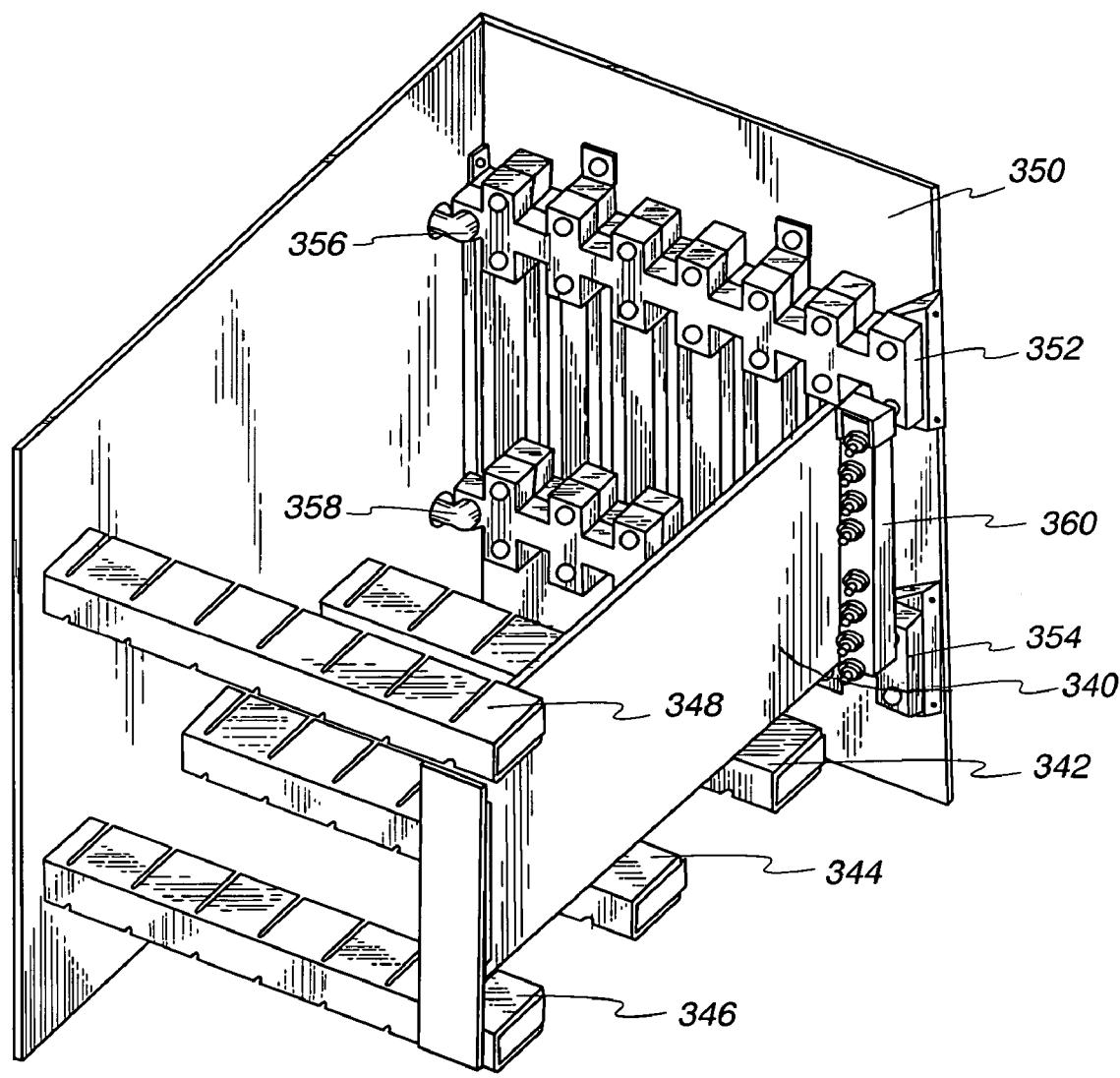
FIG. 25 is a diagrammatic isometric view of a printed circuit board mounted to a portion of a rack and showing rack mounted manifolds and a board mounted manifold.
Figure 26:
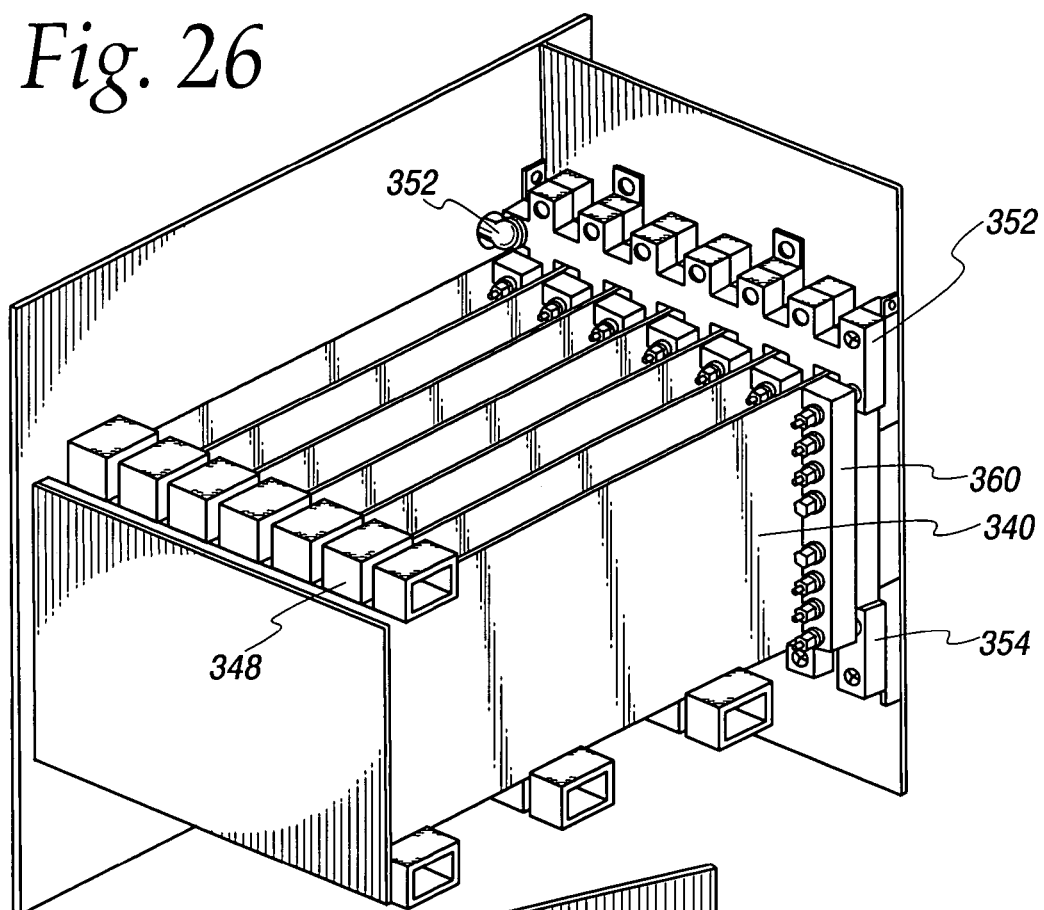
FIG. 26 is a diagrammatic right looking isometric view of a plurality of printed circuit boards mounted to a portion of a rack.
Figure 27:
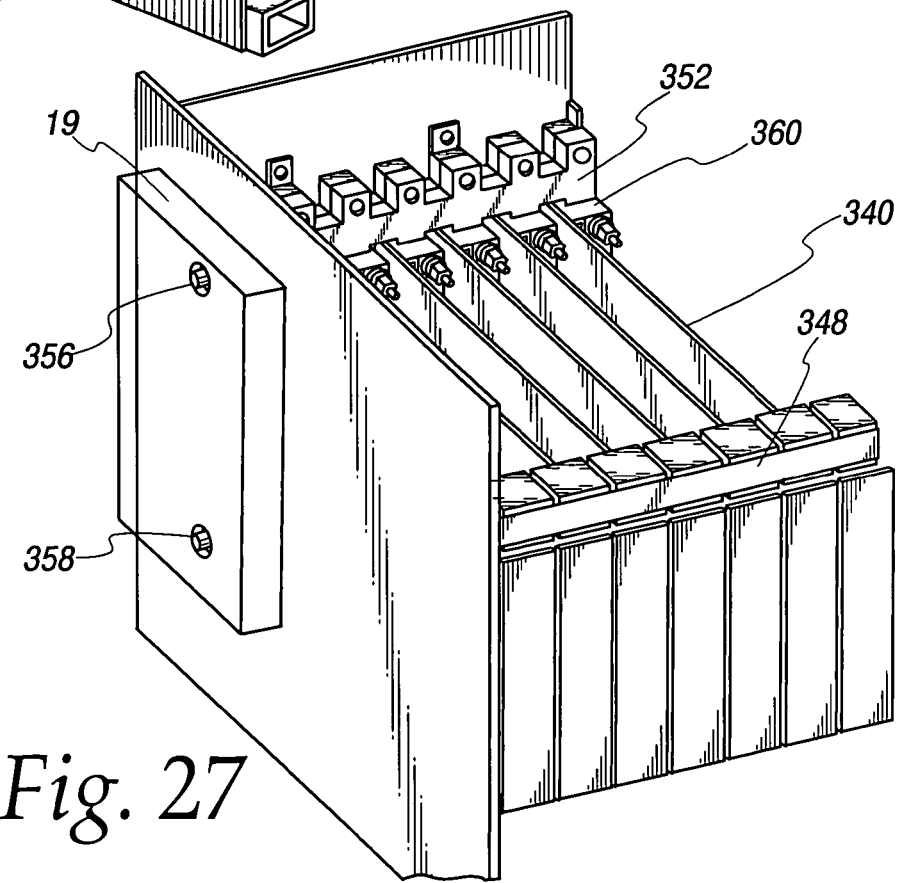
FIG. 27 is a diagrammatic left looking isometric view of the plurality of printed circuit boards mounted to the portion of a rack.

Referring now to FIGS. 25-27, there is illustrated the manner in which a plurality of PCBs are mounted to the rack. In FIG. 25, one PCB 340 is mounted to several rails 342, 344, 346, 348. Usually two additional rails are present as shown in FIG. 3, but are removed in FIG. 25 for clarity. A backplane 350 is used to mount two parallel disposed backplane manifolds 352, 354. These backplane manifolds include an inlet fitting 356 and an outlet fitting 358 that communicate with the compressor/condenser unit 19, FIG. 2, whereby refrigerant is circulated.

Each PCB has mounted to it an inlet/outlet manifold unit 360, a modification of the inlet and outlet manifolds 256, 258 shown in FIG. 24, which plugs into the backplane manifolds 352, 254 so as to extend circulation of refrigerant to the cooling assemblies mounted on the PCB 340. In FIGS. 26 and 27, additional PCBs and mounted inlet/outlet manifold units are illustrated to exemplify a fully occupied rack.

Figure 28:
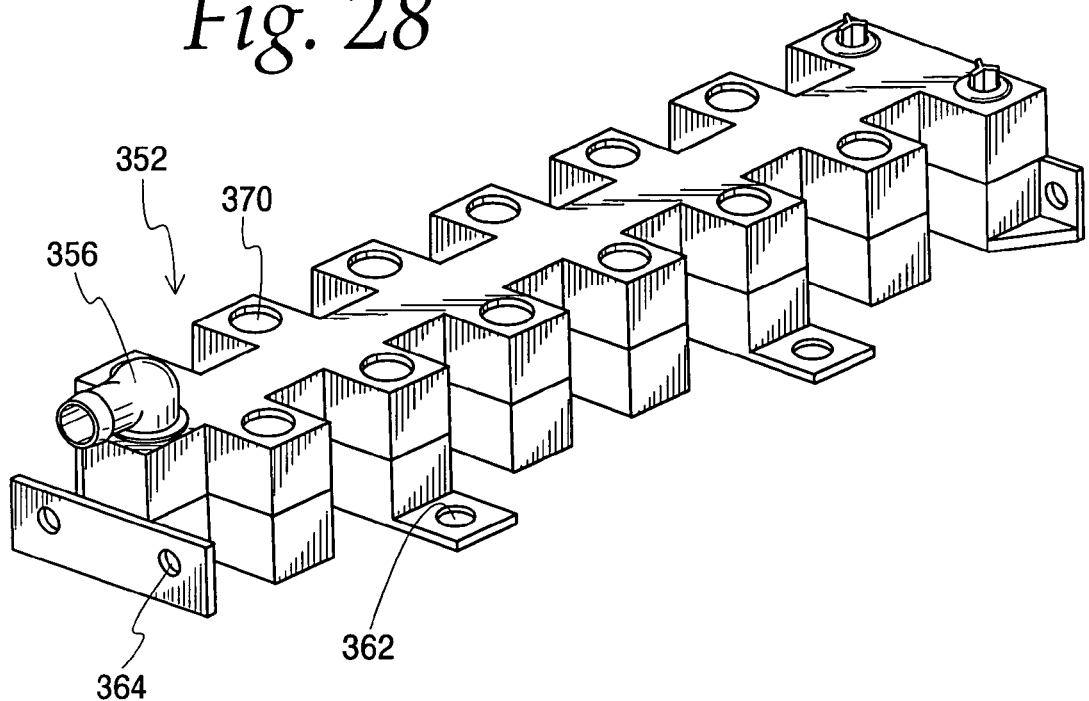
FIG. 28 is an enlarged diagrammatic isometric view of the rack mounted manifold.
Figure 29:
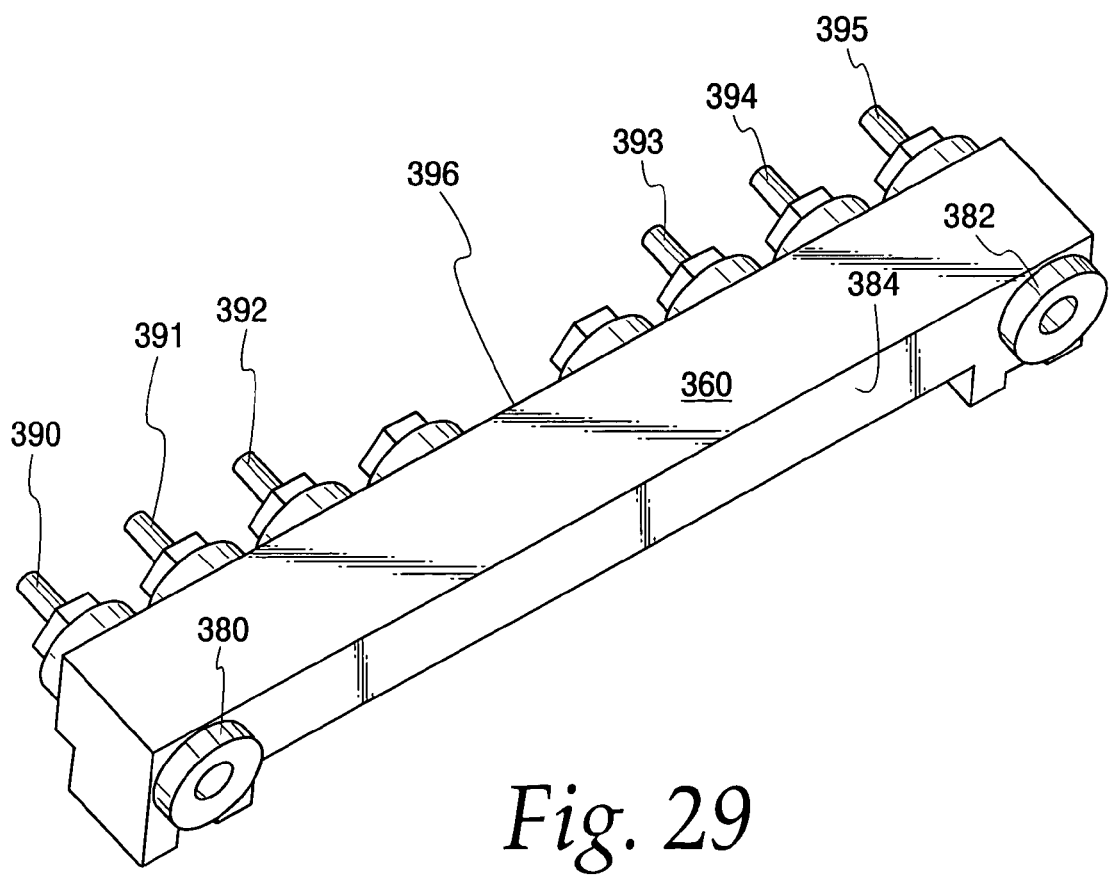
FIG. 29 is an enlarged diagrammatic isometric view of the board mounted manifold.
Figure 30:
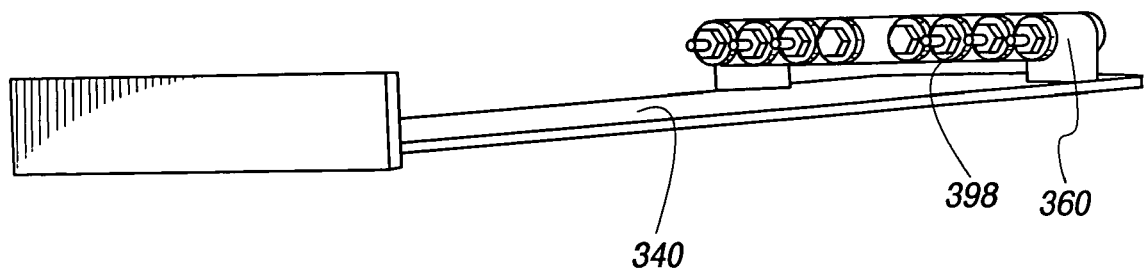
FIG. 30 is an isometric view of the board and board mounted manifold.

In FIGS. 28-30, the manifolds are shown in more detail. The backplane manifold 352 replaces a rail of the rack and includes a series of plug openings such as the plug opening 370. The inlet fitting 356 is shown as is mounting openings 362, 364 for receiving fasteners. The plug openings receive the PCB mounted inlet/outlet manifolds, such as the inlet/outlet manifold 360. The inlet/outlet manifold 360, FIG. 29, includes cylindrical plugs 380, 382 on the rear end 384 and fittings 390, 391, 392, 393, 394, 395 on the front end 396. A pass-through slot 398 is formed between the PCB 340 and the inlet/outlet manifold 360 to provide for electronics.

Figure 31:
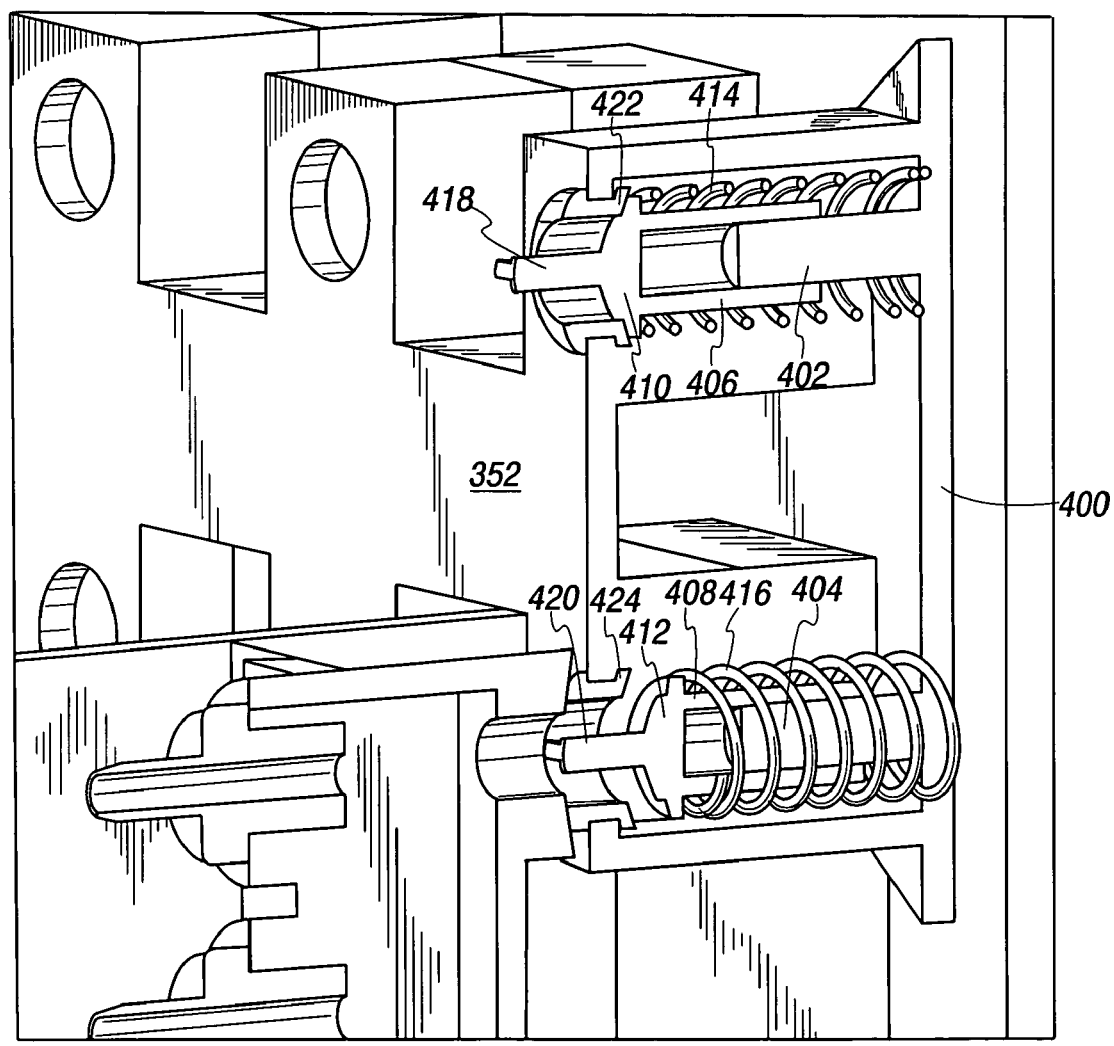
FIG. 31 is a diagrammatic sectional isometric view of self-closing fittings in the rack mounted manifold.

Referring now to FIGS. 31-34, there is illustrated self-closing fittings in the manifolds. The fittings in the backplane manifolds, such as the backplane manifold 352 is shown in FIG. 31. There is included a base 400, with posts 402, 404 and valve pins 406, 408 slidably mounted to the posts. Each pin has a flange 410, 412 to trap a spring 414, 416 between itself and the base, and an extending finger 418, 420. In the closed position, the flanges 410, 412 abut against seats 422, 424. However, when the PCB mounted manifold abuts the backplane manifold, the finger 420 of the pin 412 is pushed against the spring 416 causing the flange to move away from the seat 424 and open the fitting.

Figure 32:
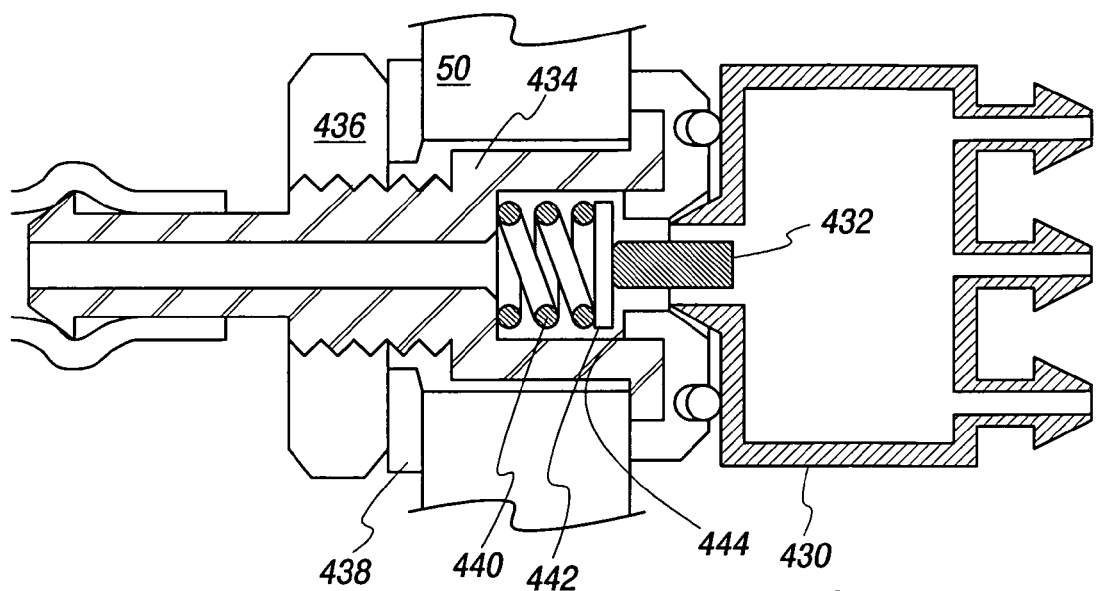
FIG. 32 is a diagrammatic sectional view of a manifold mounted to a backplane.

A similar arrangement may be used by the PCB mounted manifold, FIG. 32. There, the PCB mounted manifold 430 includes a post 432. A plug 434 mounted to the backplane 50 by a nut 436 and a washer 438 includes a spring 440 and a flange 442. A valve seat 444 is also provided. When the PCB manifold is pushed against the plug, the post 432 pushes the flange 442 against the bias of the spring 440 away from the seat 444 to open the plug.

Figure 33:
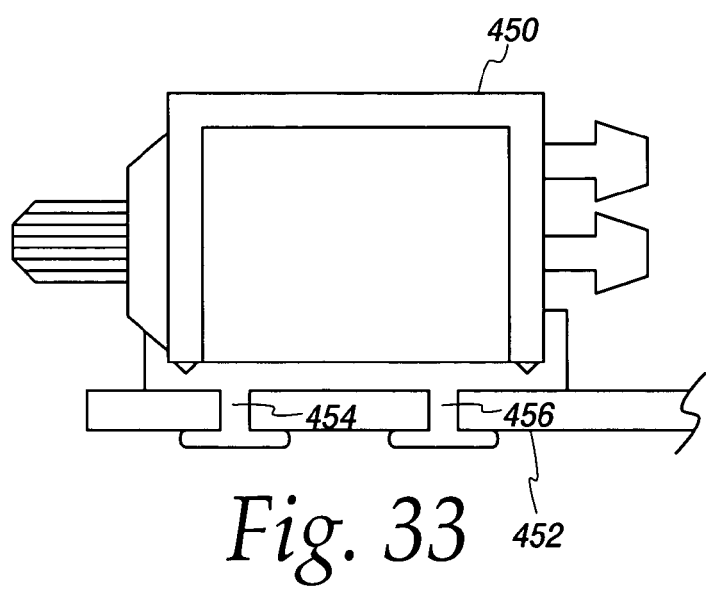
FIG. 33 is a diagrammatic sectional view of a manifold mounted to a printed circuit board.
Figure 34:
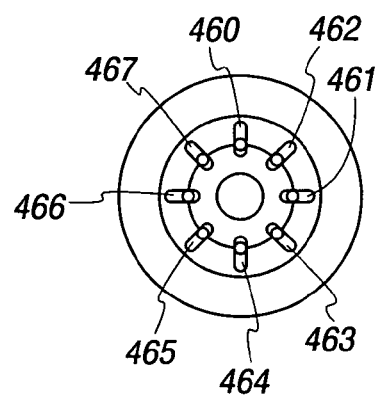
FIG. 34 is a diagrammatic elevation view of a manifold.

In FIG. 33, the PCB manifold 450 is shown mounted to a PCB 452 by heat staked tabs 454, 456 or ultrasonic welds. A circular arrangement of inlet or outlet fittings 460, 461, 462, 463, 464, 465, 466, 467, FIG. 34, may be used.

Figure 35:
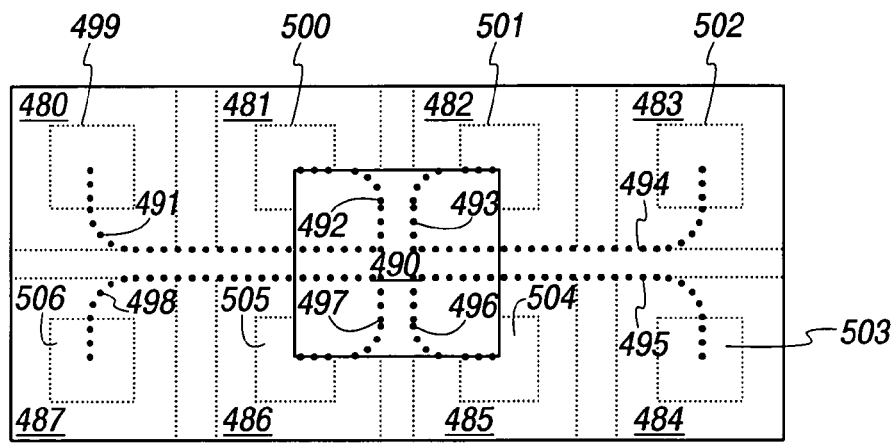
FIG. 35 is a diagrammatic plan view of a single cooling assembly and multiple heat generating components.
Figure 36:
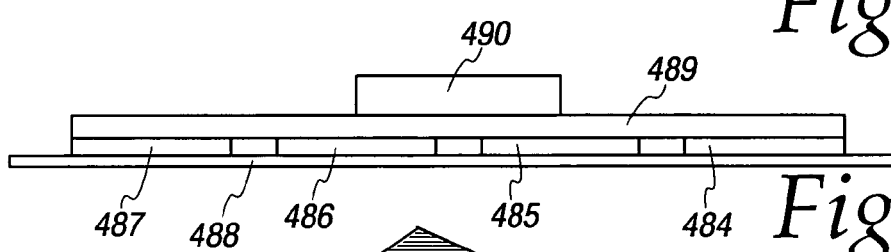
FIG. 36 is a diagrammatic elevation view of the single cooling assembly and multiple heat generating components.

Referring now to FIGS. 35 and 36, a multiple devices arrangement is illustrated. An array of heat generating devices 480, 481, 482, 483, 484, 485, 486, 487 are mounted to a PCB 488. A sheet of dielectric material 489 is placed over the devices and a cooling assembly 490 is mounted to the dielectric material. Heat pipes 491, 492, 493, 494, 495, 496, 497, 498 are embedded in the dielectric material as are heat spreaders 499, 500, 501, 502, 503, 504, 505, 506.

Figure 37:
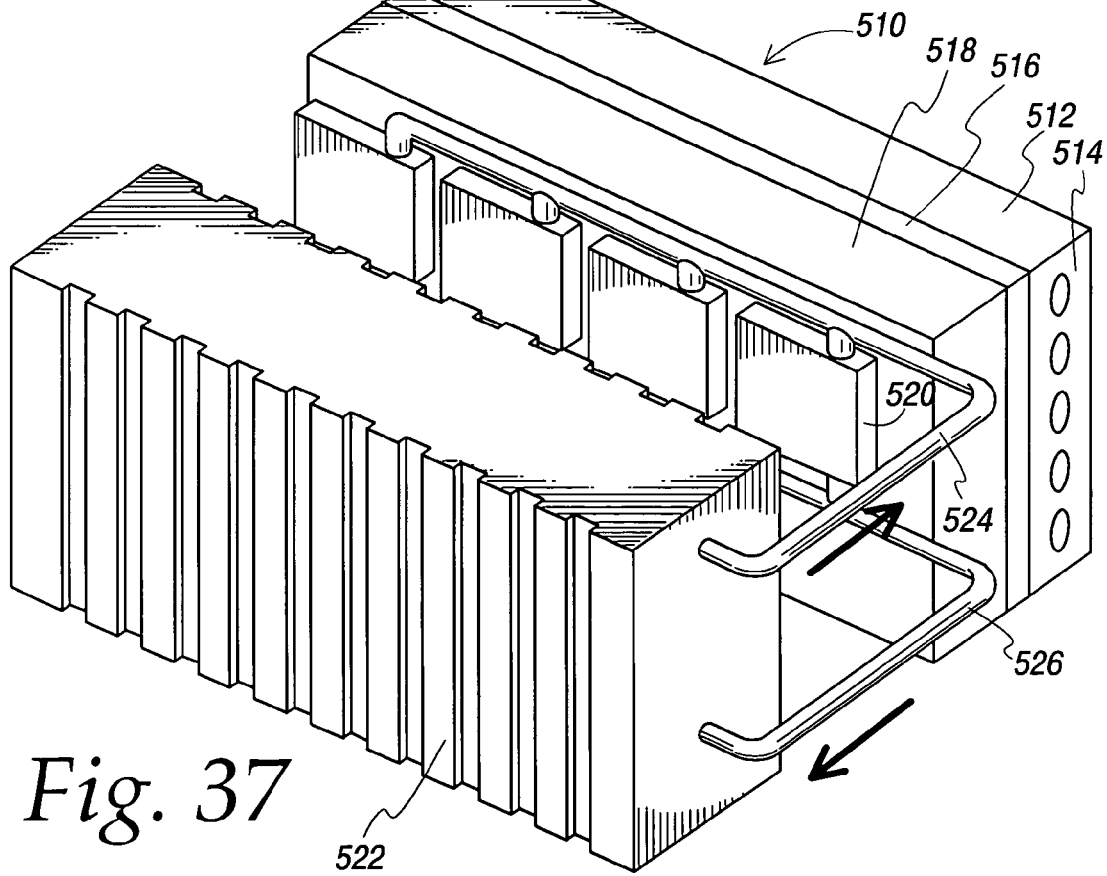
FIG. 37 is a diagrammatic isometric view of a hybrid package.

A hybrid package 510 is illustrated in FIG. 37 and includes a very compact arrangement. A first layer 512 includes DC electronics and controls and further includes indicators 514. An adjoining layer is a cover 516. A ceramic hybrid power module third layer 518 includes 3-D circuitry, planar components, such as resistors, capacitors, inductors and magnetics, as well as semiconductors. A fourth layer 520 includes an array of cooling assemblies of the type described above.

In communication with the four layers to form an integrated cooling system is a compact compressor and condenser 522 and refrigerant tubes 524, 526. The whole arrangement is in the form of a rectifier. The ceramic hybrid acts as both a heat sink and a dielectric. This results in increased density and compactness. There is no need for the larger air flow space now used. There is an increase in efficiency because the components may be kept at or even below ambient temperatures. Furthermore, there is improved reliability because of lower, more constant temperature. The vertically integrated power and controls free up valuable rack space, the planar design simplifies manufacturing. Magnetics and passives may be integrated into the 3-D ceramic package, cabinet airflow may be better managed through effecting ducting over the hybrid package, critical temperatures may be reduced by bonding to the back side of the hybrid package and the package's thermal conductivity helps cool the package internally.

The specification describes in detail variation embodiments of the present invention. Other modifications and variations will under the doctrine of equivalents or otherwise come within the scope of the appended claims. For example, other designs and placements of the manifolds, or other arrangements for the manifold valves are all considered equivalent structures. So are different arrays of cooling assemblies. Still other alternatives will also be equivalent as will many new technologies. There is no desire or intention here to limit in any way the application of the doctrine of equivalents or the scope of the claims.

The invention claimed is:

1. A cooling system for electronic equipment enclosures with densely packed components comprising:
    an electronic equipment enclosure; a rack mounted within said enclosure;
    a plurality of boards mounted to said rack, at least one of said boards having a plurality of heat generating components mounted thereon;
    a plurality of microscale cooling assemblies each one of said cooling assemblies being connected to one of said plurality of heat generating components, each cooling assembly including a heat insulative housing, an inlet port formed in said housing for receiving a heat transferring fluid, an outlet port formed in said housing for passing said heat transferring fluid, a thermally conductive element connected to said housing, an evaporator chamber formed by said housing and said thermally conductive element upstream of said outlet port and a capillary passage formed in said housing between said inlet port and said evaporator chamber;
    a first intake manifold mounted to said rack;
    a first exhaust manifold mounted to said rack;
    a second intake manifold mounted to said board and to said first intake manifold;
    a second exhaust manifold mounted to said board and to said first exhaust manifold;
    a first fluid conduit connecting said board mounted second intake manifold and each of said plurality of cooling assemblies;
    a second fluid conduit connecting said board mounted second exhaust manifold and each of said plurality of cooling assemblies;
    a compressor;
    a third fluid conduit connecting said rack mounted first intake manifold and said compressor; and
    a fourth fluid conduit connecting said rack mounted first exhaust manifold and said compressor.

2. The system of claim 1 wherein:
    said rack includes a rail; and
    said plurality of boards are mounted to said rail.

3. The system of claim 1 including:
    a backplane connected to said rack; and wherein
    said plurality of boards are mounted to said backplane.

4. The system of claim 1 including:
    a backplane connected to said rack; and
    said first intake manifold and said first exhaust manifold are connected to said backplane.

5. The system of claim 1 including:
    a backplane connected to said rack; and wherein
    said rack includes a rail;
    said first intake manifold and said first exhaust manifold are connected to said backplane; and
    said plurality of boards are mounted to said rail and to said backplane.

* * * * *